United States Patent
Stangl

(10) Patent No.: US 8,927,324 B2
(45) Date of Patent: Jan. 6, 2015

(54) METHOD FOR THE PRODUCTION OF A WAFER-BASED, BACK-CONTACTED HETEROJUNCTION SOLAR CELL AND HETEROJUNCTION SOLAR CELL PRODUCED BY THE METHOD

(75) Inventor: Rolf Stangl, Berlin (DE)

(73) Assignee: Helmholtz-Zentrum Berlin Fuer Materialien und Energie GmbH, Berlin (DE)

( * ) Notice: Subject to any disclaimer, the term of this patent is extended or adjusted under 35 U.S.C. 154(b) by 896 days.

(21) Appl. No.: 13/123,739

(22) PCT Filed: Oct. 10, 2009

(86) PCT No.: PCT/DE2009/001404
§ 371 (c)(1),
(2), (4) Date: Sep. 9, 2011

(87) PCT Pub. No.: WO2010/043201
PCT Pub. Date: Apr. 22, 2010

(65) Prior Publication Data
US 2011/0308599 A1 Dec. 22, 2011

(30) Foreign Application Priority Data
Oct. 13, 2008 (DE) .......... 10 2008 051 521

(51) Int. Cl.
H01L 21/00 (2006.01)
H01L 31/0224 (2006.01)
H01L 31/0747 (2012.01)
H01L 31/18 (2006.01)

(52) U.S. Cl.
CPC .... *H01L 31/022441* (2013.01); *H01L 31/0747* (2013.01); *H01L 31/1804* (2013.01); *Y02E 10/547* (2013.01)

USPC .......... 438/98; 438/57; 438/71; 438/84; 438/85; 438/83; 438/93; 438/96

(58) Field of Classification Search
USPC .......... 438/98, 93, 96, 83, 84, 85, 57, 71
See application file for complete search history.

(56) References Cited

U.S. PATENT DOCUMENTS

| | | |
|---|---|---|
| 5,468,652 A | 11/1995 | Gee |
| 7,199,395 B2 | 4/2007 | Terakawa |
| 2004/0187916 A1 | 9/2004 | Hezel |
| 2006/0130891 A1 | 6/2006 | Carlson |
| 2007/0184975 A1 | 8/2007 | Yi |
| 2009/0211628 A1 | 8/2009 | Engelhart |
| 2009/0266401 A1 | 10/2009 | Stangl |

FOREIGN PATENT DOCUMENTS

| | | |
|---|---|---|
| DE | 4143083 A1 | 7/1993 |
| DE | 4143084 A1 | 7/1993 |
| DE | 10142481 A1 | 3/2003 |
| DE | 102004046654 A1 | 4/2006 |
| DE | 102005040871 A1 | 10/2006 |
| DE | 102006027737 A1 | 12/2007 |
| JP | 2005268683 A | 9/2005 |
| WO | WO 2006135443 A2 | 12/2006 |

OTHER PUBLICATIONS

Stangl R., et al, Planar rear emitter back contact silicon heterojunction solar cells, Solar Energy Materials and Solar Cells, Elsevier Science Publishers, Amsterdam, NL, vol. 93, Nr:10, pp. 1900-1903, 2009.

Van Kerschaver E, et al, Back-contact solar cells: a review, Progress in Photovoltaics. Research and Applications, John Wiley and Sons, Chichester, GB, vol. 14, Nr:2, pp. 107-123, 2006.

*Primary Examiner* — Timor Karimy
(74) *Attorney, Agent, or Firm* — Leydig, Voit & Mayer, Ltd.

(57) ABSTRACT

A method for the production of a wafer-based, back-contacted heterojunction solar cell includes providing at least one absorber wafer. Metallic contacts are deposited as at least one of point contacts and strip contacts in a predetermined distribution on a back side of the at least one absorber wafer. The contacts have steep flanks that are higher than a cumulative layer thickness of an emitter layer and an emitter contact layer and are sheathed with an insulating sheath. The emitter layer is deposited over an entire surface of the back side of the at least one absorber wafer. The emitter contact layer is deposited over an entire surface of the emitter layer so as to form an emitter contact system. At least one of the emitter layer and the emitter contact layer is selectively removed so as to expose the steep flanks of the contacts that are covered with the insulating sheath. An insulation layer is deposited over an entire surface of the emitter contact layer so as to provide a narrow contact web at an edge of the at least one absorber wafer. End areas of the steep flanks of the contacts that are covered by the insulation layer are exposed. At least one of an absorber contact layer and an absorber contact grid is deposited over an entire surface of the insulation layer and over the exposed end areas of the steep flanks so as to form the absorber contact system, so as to provide the heterojunction solar cell with the contact web and with the at least one of an absorber contact layer and an absorber contact grid of the absorber contact system.

15 Claims, 3 Drawing Sheets

METHOD FOR THE PRODUCTION OF A WAFER-BASED, BACK-CONTACTED HETEROJUNCTION SOLAR CELL AND HETEROJUNCTION SOLAR CELL PRODUCED BY THE METHOD

CROSS-REFERENCE TO PRIOR APPLICATIONS

This application is a U.S. National Phase application under 35 U.S.C. §371 of International Application No. PCT/DE2009/001404, filed on Oct. 10, 2009, and claims benefit to German Patent Application No. DE 10 2008 051 521.3, filed on Oct. 13, 2008. The International Application was published in German on Apr. 22, 2010 as WO 2010/043201 A2 under PCT Article 21(2).

FIELD

The invention relates to a method for the production of a wafer-based, back-contacted heterojunction solar cell, and to a heterojunction solar cell produced with the method.

BACKGROUND

Solar cells are components that convert light into electric energy. Normally, they are made of semiconductor materials that contain areas or layers of different conductivity for positive and negative charge carriers, namely, conductive areas of the n-type or p-type. These areas are referred to as emitters (emitter layer) and absorbers (absorber layer, absorber wafer). Positive and negative excess charge carriers generated in the absorber by incident light are separated at the pn-junction between the emitter and the absorber and can then be collected and discharged by the contact systems that are electrically conductively connected to the appertaining emitter and absorber areas. The excess majority charge carriers from the absorber are collected and discharged by an absorber contact system (majority charge carrier contact system) and the excess minority charge carriers from the absorber are collected and discharged by the emitter and by an emitter contact system (minority charge carrier contact system) that contacts said emitter. Consequently, only those excess charge carriers that reach the contact systems and that do not recombine before that with a charge carrier of the opposite charge contribute to the useful electric performance of solar cells.

Back-contacted solar cells have both contact systems for separately collecting the excess majority and minority charge carriers from the absorber wafer on the side of the solar cell facing away from the light. For one thing, this has the fundamental advantage that only this side of the absorber wafer needs to processed for contacting purposes, while the other side remains unprocessed when it comes to the contacting. If the absorber wafer is of a sufficiently high electronic quality, in other words, if the effective diffusion length of the minority charge carriers is greater than the thickness of the wafer, then the current-dissipating contact systems can be on the back of the solar cell facing away from the light. This especially entails the advantages that, first of all, no shading losses occur due to a contact system that is on the front, thus improving the efficiency of the solar cell, and secondly, the front of the solar cell facing the light can be passivated easily and properly over the entire surface so as to effectively and easily prevent a recombination of the excess charges. Moreover, back-contacted solar cells can be more easily interconnected to form modules and they are esthetically very attractive.

However, conventional back-contacted solar cells entail several drawbacks. Their production processes are usually complicated. Some processes call for several masking steps, several etching steps and/or several vapor-deposition steps in order to create the absorber contact system so that it is electrically separated from the emitter contact system on the back of the wafer. Moreover, conventional back-contacted solar cells are often prone to local short-circuits caused, for instance, by inversion layers between the absorber and the emitter or by inadequate insulation between the contacts, which translates into a reduced efficiency of the solar cell.

One concept of one-sided back contacting puts forward the use of surface elevations as described, for example, in German patent application DE 41 43 083 A1. Here, the first and second contact systems are arranged directly, or else on an insulation layer, on a semiconducting substrate surface having elevations (for instance, in the form of pyramids, cones or cylinders), whereby the elevations have previously been covered, at least in certain areas, with passivation material, and these elevations are subsequently exposed in certain areas so that the contact systems can be applied. German patent application DE 41 43 084 A1 describes first passivating the entire structured substrate surface and subsequently removing the passivation layer in the area of the elevations. German patent application DE 101 42 481 A1 describes arranging these elevations in the form of ribs on the bottom of the active semiconductor substrate and providing each rib flank with a contact system by means of targeted vapor-deposition. Part of this concept is thus to always create elevations on the bottom of the substrate and to then process them in different ways. German patent application DE 10 2005 040 871 A1 describes a back-contacted solar cell in which the emitter contact as well as the absorber contact are electrically insulated from each other by flanks on which a metallization layer that has been previously applied to their entire surface is removed by etching. The n-doped and p-doped areas that are to be contacted are interdigitated either only on the back of the wafer, or else on the front and back of the wafer, whereby the doped area on the front of the wafer extends along wafer channels to the back of the wafer.

Another concept of back contacting for a wafer-based system is point contacting (PC). Here, both contact systems are kept very small in the form of points on the back of the solar cell so as to lower the saturation reverse current and thus to increase the open circuit voltage of the solar cell. U.S. Pat. No. 5,468,652 describes, for instance, point contacting in which the emitter layer arranged on the top of the absorber wafer facing the light is contacted with a contact system on the back of the wafer by point contacts through the absorber wafer. Here, this contact system is arranged so as to be nested side by side with the contact system for dissipating the majority charge carriers of the absorber layer.

U.S. Pat. Appl. 2006/0130891 A1 describes a back-contacted heterojunction solar cell having an absorber wafer and a back emitter layer configured as a surface with punctiform or strip-shaped vias. Additional functional layers can also be provided. The absorber wafer and the emitter layer consist of oppositely doped semiconductor materials and they span a pn-junction.

The emitter layer is contacted by a back emitter contact system that is configured as a surface with punctiform or strip-shaped vias. The absorber wafer is contacted by a back absorber contact system that is configured as an absorber contact layer or as an absorber contact grid with point contacts or strip contacts that extend through the punctiform or strip-shaped vias of the emitter contact layer. The two contact systems lie one above the other on the back of the absorber wafer, which is not intended for exposure to incident light, and they are electrically insulated with respect to each other by an insulation layer. During the production of such a solar cell, first of all, the layers are built up, all the way to and including the insulation layer, which is then appropriately structured in order to create the point contacts or strip contacts of the absorber contact system, for instance, by means of laser structuring. Subsequently, a metal layer is applied so as to fill the previously created structures. A special difficulty encountered with such back-contacted solar cells is the laborious production of the back contacts during which it is absolutely necessary to prevent electric short-circuits.

German patent application DE 2004 046 554 A1 describes a punctiform back contacting of the absorber wafer for a solar cell that is contacted on both sides, in which a plurality of peaks of a back contact layer extend through an oxidation layer on the absorber wafer (light scatter layer) or pass through said layer after the laser firing. U.S. Pat. Appl. 2007/0184975 A1 describes the production of a large, catalytically active surface in that a substrate is provided with catalytically active titanium dioxide needles.

SUMMARY

In an embodiment, the present invention provides a method for the production of a wafer-based, back-contacted heterojunction solar cell having at least one absorber wafer and a back emitter layer each including a respective semiconductor material doped opposite to the other respective semiconductor material. The at least one absorber wafer is contacted by a back absorber contact system including at least one of an absorber contact layer and an absorber contact grid. The emitter layer is contacted by a back emitter contact system including an emitter contact layer. The emitter layer and the emitter contact layer each have corresponding punctiform or strip-shaped vias. The at least one of an absorber contact layer and an absorber contact grid includes punctiform or strip-shaped contacts configured to extend through the punctiform or strip-shaped vias of the emitter layer and the emitter contact layer. The back absorber contact system and the back emitter contact system are electrically insulated from one another by an insulation layer. In the method, at least one absorber wafer is provided. Metallic contacts are deposited as at least one of point contacts and strip contacts in a predetermined distribution on a back side of the at least one absorber wafer. The metallic contacts have steep flanks that are higher than a cumulative layer thickness of the emitter layer and the emitter contact layer. The metallic contacts are sheathed with an insulating sheath. The emitter layer is deposited over an entire surface of the back side of the at least one absorber wafer. The emitter contact layer is deposited over an entire surface of the emitter layer so as to form the emitter contact system. At least one of the emitter layer and the emitter contact layer is selectively removed so as to expose the steep flanks of the metallic contacts that are covered with the insulating sheath. The insulation layer is deposited over an entire surface of the emitter contact layer so as to provide a narrow contact web at an edge of the at least one absorber wafer. End areas of the steep flanks of the metallic contacts that are covered by the insulation layer are exposed. The at least one of an absorber contact layer and an absorber contact grid is deposited over an entire surface of the insulation layer and over the exposed end areas of the steep flanks so as to form the absorber contact system, so as to provide the heterojunction solar cell with the contact web of the emitter contact system and with the at least one of an absorber contact layer and an absorber contact grid of the absorber contact system.

BRIEF DESCRIPTION OF THE DRAWINGS

The method for the production of a wafer-based, back-contacted heterojunction solar cell and of such a solar cell itself according to the invention will be explained in greater detail below on the basis of embodiments depicted in the exemplary, schematic figures, which are not to scale. The invention is not limited to the exemplary embodiments. Other features and advantages of various embodiments of the present invention will become apparent by reading the following detailed description with reference to the attached drawings which illustrate the following:

FIG. 1J shows a cross section through a finished wafer-based, back-contacted heterojunction solar cell.

Like reference numerals in the figures indicate like components and reference numerals that are not included in a particular figure can be determined by reference to the other figures or in the descriptions thereof.

DETAILED DESCRIPTION

Figure 1A:
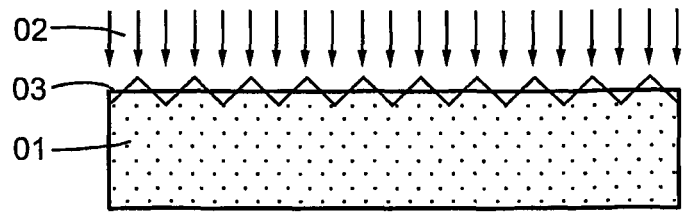
FIG. 1A to 1J schematically illustrates steps of the method according to an embodiment of the present invention, with optional additional method steps, whereby

An embodiment of the present invention provides a method for the production of a wafer-based, back-contacted heterojunction solar cell of the above-mentioned type which, in a simple manner, makes do without laborious structuring measures for the two contact systems. Nevertheless, a reliably functioning solar cell with a good electric separation of the two contact systems and the highest possible efficiency. Moreover, in an embodiment, a wafer-based, back-contacted heterojunction solar cell having a contact build-up that differs from that of the state of the art is provided.

In an embodiment, the present invention provides a wafer-based, back-contacted heterojunction solar cell, comprising at least one absorber wafer and a back emitter layer which consists of oppositely doped semiconductor materials and which is configured as a surface with punctiform or strip-shaped vias, whereby the emitter layer is contacted at a back side by an emitter contact system that has an emitter contact layer with punctiform or strip-shaped vias that are congruent with the vias in the emitter layer, and the absorber wafer is contacted by a back absorber contact system that has an absorber contact layer or absorber contact grid with punctiform or strip-shaped contacts that extend through the punctiform or strip-shaped vias of the emitter contact layer and of the emitter layer, and whereby both contact systems are electrically insulated with respect to each other by an insulation layer.

In the method according to an embodiment of the present invention for the production of a wafer-based, back-contacted heterojunction solar cell, first of all, the point contacts or strip contacts are applied onto the absorber wafer and only then is the layer built up. This approach eliminates all of the structuring steps, especially laborious laser-assisted structuring measures so that less resolving structures can be produced more easily. With embodiments of the present invention, the structuring is done implicitly during the layer build-up or when the previously applied layers are removed. In the known production processes, in contrast, the layer is built up first and subsequently, targeted structuring measures are undertaken, especially the drilling of holes. With embodiments of the present invention, in contrast, the layers applied over the entire surface surround each of the previously applied contacts and thus are implicitly structured.

In order to avoid short-circuits and for contacting purposes, appropriate layers on the contacts are selectively removed. Towards this end, the contacts have steep flanks which, owing to their primarily vertical orientation relative to the absorber wafer, are coated with thinner layers during the deposition of the functional layers. In this context, the term "steep flanks" means flanks that enclose an internal angle between 20° and 90° relative to the substrate. Such steep flanks can be present in the case of point contacts or strip contacts having a high aspect ratio, that is to say, a small face width and a large height, for example, 1:5 to 1:10. As the aspect ratio decreases, the angle of the steep flanks becomes more relevant. Therefore, in the case of a very small aspect ratio, for instance, 20:1, which corresponds to a fairly flat extension of the contact, its flanks have to nevertheless be configured so as to be appropriately steep in the above-mentioned angular range. Thus, it is possible to choose between a high aspect ratio with a fundamentally great steepness of the flank and a great steepness of the flank with a small aspect ratio or any combination in-between that yields the required steep flanks whose layers have been applied with a smaller thickness than those of the horizontal surfaces, so that these might have been removed before the application onto the horizontal surfaces. Consequently, when these layers are removed, for instance, by means of etching or roughening, the thinner layers on the steep flanks are completely removed first, so that when the removal procedure is stopped, the layers on the horizontal surfaces are still present with a sufficient thickness at this point in time.

In greater detail, the method according to an embodiment of the present invention, which is also suitable for use in thin-layer solar cells, comprises at least the following steps:
I. providing the absorber wafer,
II. depositing metallic point contacts or strip contacts with steep flanks in the prescribed distribution onto the back of the absorber wafer, which is not intended for exposure to incident light, whereby the steep flanks are higher than the cumulative layer thickness of the emitter layer and the emitter contact layer,
III. sheathing the point contacts or strip contacts with an insulating sheath,
IV. depositing the emitter layer over the entire surface onto the back of the absorber wafer,
V. depositing the emitter contact layer over the entire surface onto the emitter layer in order to form the emitter contact system,
VI. exposing the steep flanks of the point contacts or strip contacts that are covered with the insulating sheath by selectively removing the emitter contact layer and the emitter layer,
VII. depositing the insulation layer over the entire surface onto the emitter contact layer, whereby a narrow contact web is left free at the edge of the absorber wafer,
VIII. exposing end areas of the steep flanks of the point contacts or strip contacts that are covered with insulation layer,
IX. depositing the absorber contact layer or absorber contact grid over the entire surface onto the insulation layer and onto the exposed end areas of the steep flanks of the point contacts or strip contacts in order to create the absorber contact system, and
X. contacting the heterojunction solar cell with the contact web of the emitter contact system and via the absorber contact layer of the absorber contact system.

FIG. 1A—Front structuring of the absorber wafer
First of all, an absorber wafer 01 is provided, which is made of crystalline silicon here. Subsequently, the absorber wafer 01 is structured or textured on its front 03, which is intended for exposure to incident light 02. In the embodiment shown, this is done by generating random pyramids by means of etching with potassium hydroxide solution (KOH).

Figure 1B:
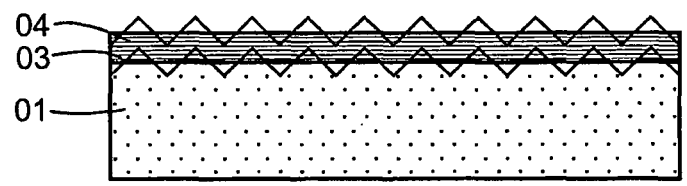

FIG. 1B—Front Passivation/Antireflection Coating
The textured front 03 of the absorber wafer 01 is provided with one or more passivation and/or antireflection layers 04. In the embodiment shown, this can be done by means of the plasma-enhanced chemical vapor deposition (PECVD) of $SiO_2$/SiN layers.

Figure 1C:
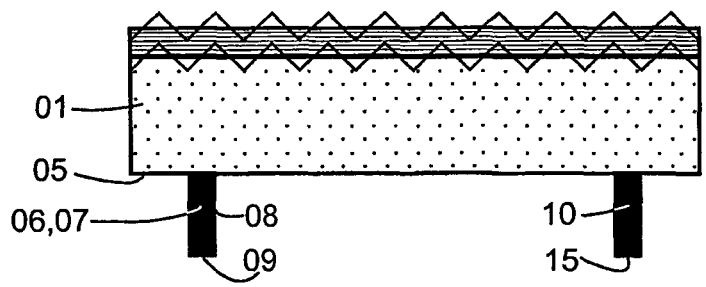

FIG. 1C—Deposition of Point Contacts or Strip Contacts
In the embodiment shown, metallic deposits 06 are deposited onto the back 05 of the absorber wafer 01, which is not intended for exposure to incident light. In the embodiment shown, this is done by means of the electron beam physical vapor deposition of aluminum over a shadow mask. As an alternative, a metallic paste can be applied by means of screen printing or inkjet printing. These punctiform deposits 05 later form point contacts 07 extending from the absorber contact layer to the back 05 of the absorber wafer 01. The metallic point contacts 07 have steep flanks 08 with end areas 09. For the subsequent selective etching procedure, it is necessary for the point contacts 07 to have steep flanks 08 with a great flank steepness, so that only the appropriate areas (horizontally or vertically) are selectively etched away. Here, very flat flanks do not yield the desired results. Moreover, the steep flanks 08 are higher than the cumulative layer thickness of the emitter layer and emitter contact layer, so that, in their finished state, the point contacts 07 can protrude out of these layers and can be contacted.

The metallic deposits 06 can extend over the surface and can have a diameter, for example, of 100 μm and a height of 5 μm. For the above-mentioned reasons, a decisive factor in the configuration of the metallic deposits 06 is the flank steepness of the lateral rim. Therefore, the point contacts can preferably also be configured as steep needles 10 (depicted here with faces 15, or alternatively with tips). As an alternative, strip contacts, for example, in the form of sharp blades, can also be provided.

Optionally, after the point contacts 07 have been deposited, contact firing can be carried out in order to form minority-charge backscattering fields (BSF) in the absorber wafer 01 below the point contacts 07. Here, the contact firing is usually done by means of a rapid thermal process (RTP). Contact firing by means of a laser is likewise possible.

Figure 1D:
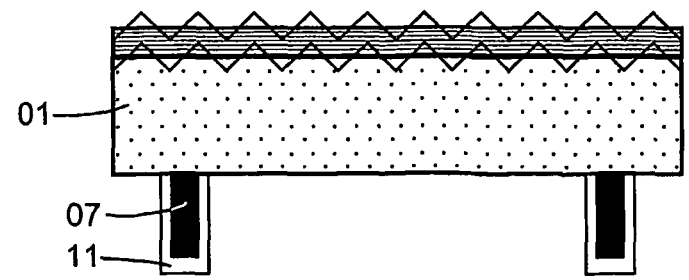

FIG. 1D—Electric Insulation of the Metallic Point Contacts
The metallic point contacts 07 arranged on the back are sheathed by means of an insulating sheath 11 so as to be electrically insulated. In the embodiment shown, this is done by means of direct point-structured deposition of an insulation layer by applying an insulating paste by means of screen printing or inkjet printing. As an alternative, an insulation layer can also be deposited over the entire surface, for instance, by means of the PECVD of $SiO_2$ and subsequent selective etching by depositing a punctiform masking layer, for instance, by means of screen printing or inkjet printing. Alternatively, for example, when aluminum is used as the point contact material, it is possible to carry out an electrochemical oxidation of the metallic point contact, for instance, by creating an $Al_2O_3$ insulation layer on the surface of the point contacts.

Cleaning the Back of the Wafer
Selective etching, for example, with an HF dip, then exposes most of the back 5 of the absorber wafer 01, which is not intended for exposure to incident light and which is not covered by the electrically insulating sheathed point contacts 07. Natural oxides or impurities stemming from the preceding method steps are removed without the insulating sheath 11 of the point contacts 07 being removed in the process.

Figure 1E:
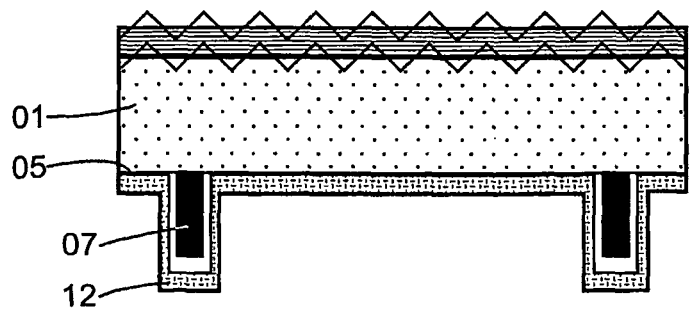

FIG. 1E—Deposition of the Back Emitter Layer Over the Entire Surface

An emitter layer 12 (thin layer, for example, made of amorphous silicon), whose doping is opposite to that of the absorber wafer 01, is deposited over the entire surface of the back 05 of the absorber wafer 01; in the embodiment shown, this deposition is done by means of the PECVD of 30 nm a-Si:H. The deposited emitter layer 12 must be capable of properly passivating the exposed boundary surface towards the absorber wafer 01. The emitter layer 12 then covers the surface of the absorber wafer 01 as well as the surface of the electrically insulating sheathed point contacts 07.

Figure 1F:
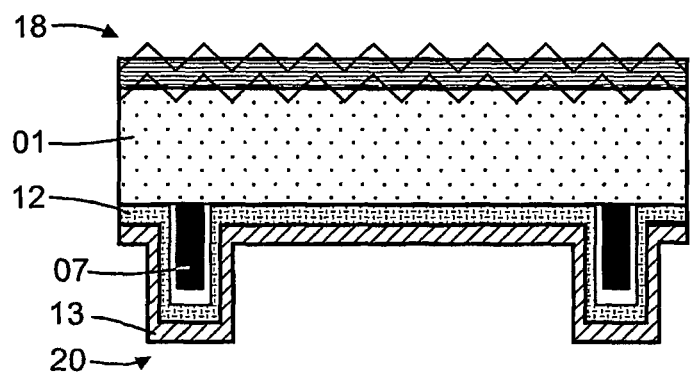

FIG. 1F—Deposition of the Back Emitter Contact Layer Over the Entire Surface

A metallic emitter contact layer 13 (layer thickness of, for instance, 500 nm) is deposited over the entire surface onto the back emitter layer 12; in the embodiment shown, this is done by means of the electron beam physical vapor deposition of aluminum, alternatively by applying conductive pastes by means of screen printing or inkjet printing. The emitter contact layer 13 forms the emitter contact system 20 in the claimed heterojunction solar cell 18.

Figure 1G:
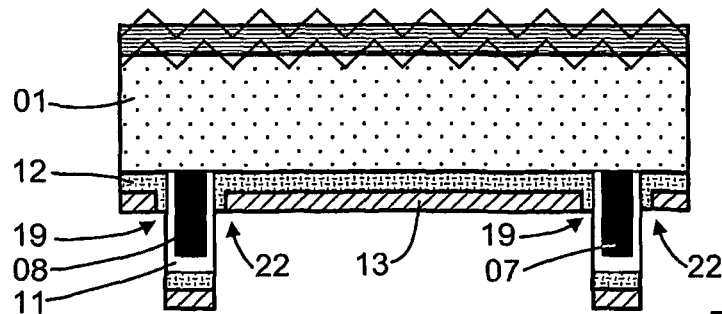

FIG. 1G—Exposing the Insulated Steep Flanks

The metallic emitter contact layer 13 and the emitter layer 12 are removed from the lateral steep flanks 08 of the insulating sheathed point contacts 07. In the embodiment shown, this is done by means of an etching dosed over time since, in view of the great flank steepness, the lateral steep flanks 08 are not covered by as much of the emitter contact layer 13 and of the emitter layer 12 as the planar back 05 of the absorber wafer 01.

Punctiform vias 19 are formed in the emitter layer 12 (corresponding to the strip-shaped vias for strip contacts) in the area of the point contacts 07 by exposing the insulated steep flanks 08. In the area of the point contacts 07, additional punctiform vias 22 that are congruent with the vias 19 in the emitter layer 12 are formed in the emitter contact layer (analogously to the strip-shaped vias in the case of strip contacts).

Figure 1H:
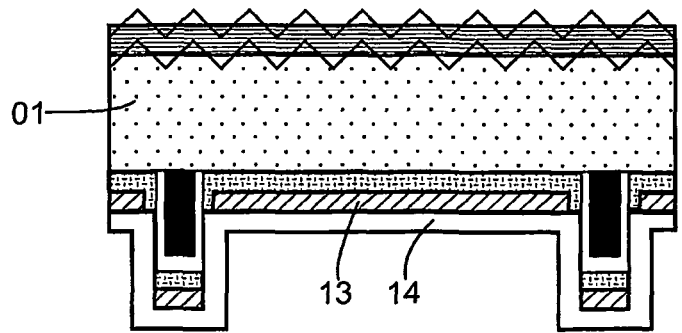

FIG. 1H—Deposition of the Back Insulation Layer Over the Entire Surface

For purposes of electrically insulating the emitter contact layer 13 with respect to the absorber contact layer 17, an insulation layer 14 is deposited onto the emitter contact layer 13; in the embodiment shown, this deposition is done by means of the PECVD of 500 nm $SiO_2$. As an alternative, for instance, an organic resin or a photoresist can be applied, screen-printed, inkjet-printed, squeegee-coated or spin-coated.

For the contacting of the emitter contact layer 13 later on, a narrow web on the edge of the absorber wafer 01 is not covered with the insulation layer 14 (not shown in FIG. 1H).

Figure 1I:
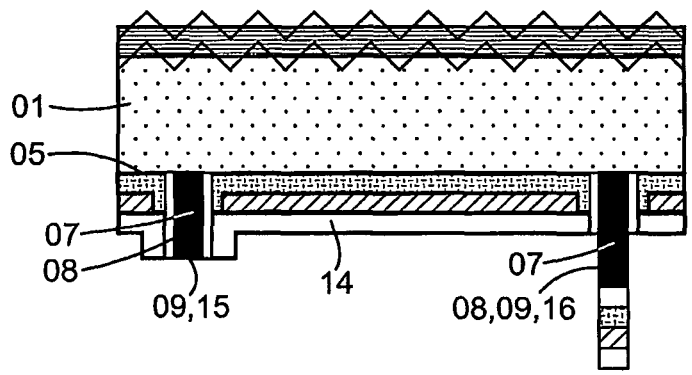

FIG. 1I—Exposing the Metallic Point Contacts

The punctiform metallic point contacts 07 that have been covered with the insulation layer 14 are exposed in the end area 09 of the steep flanks 08. These are either faces 15 (left-hand side of FIG. 1I) or lateral circumferential surfaces 16 (right-hand side of FIG. 1I) of the steep flanks 08. When the circumferential surfaces 16 are exposed, the exposed functional layer residues can be removed accordingly. When needles 10 are used as point contacts 07 (or blades as the strip contacts), as a rule, no faces 15 are created, or else their dimensions are so small that the lateral circumferential surfaces 16 are used for contacting purposes.

The exposure in the selected embodiment is done by means of mechanical roughening. As an alternative, a selective etching procedure can be carried out that attacks the steep flanks 08 of sheathed point contacts 07 that, because of the greater steepness of the steep flanks 08, have less covering than that of the planar back 05 of the absorber wafer 01.

Figure 1J:
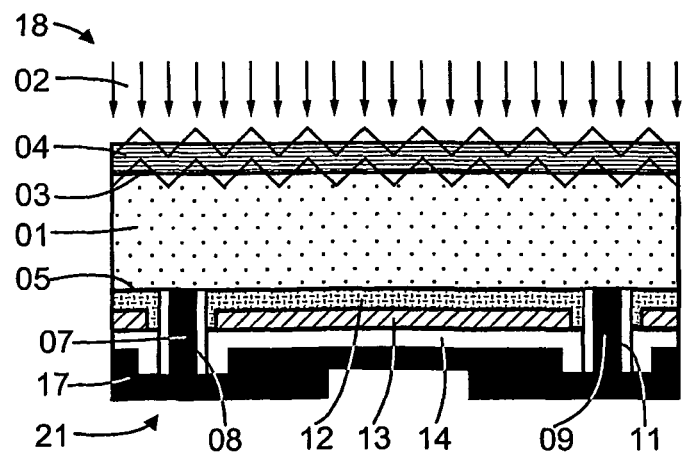

FIG. 1J—Deposition of the Back Absorber Contact Layer Over the Entire Surface

Now, a metallic absorber contact layer 17 is deposited over the entire surface of the back insulation layer 14; in the embodiment shown, this is done by means of the electron beam physical vapor deposition of aluminum or alternatively by applying conductive pastes by means of screen printing or inkjet printing. Together with the point contacts 07, the absorber contact layer 17 forms the absorber contact system 21 in the claimed heterojunction solar cell 18.

Contacting of the Finished Heterojunction Solar Cell

The heterojunction solar cell 18 is subsequently contacted by the web that has been left free on the back emitter contact layer 13 and the back absorber contact layer 17.

FIG. 1J shows a finished wafer-based heterojunction solar cell 18 with back contacting. Except for the absorber wafer 01, all of the functional layers are built up as thin layers. Texturing as well as a passivation and/or antireflection layer 04 are provided on the front 03 of the absorber wafer 01, which is not intended for exposure to incident light 02. Metallic point contacts 07 (or strip contacts) with steep flanks 08—which are higher than the cumulative layer thickness of the emitter layer 12 and of the emitter contact layer 13—are deposited in the prescribed distribution on the back 05 of the absorber wafer 01. The steep flanks 08 are sheathed with an insulating sheath 11 and covered with the absorber contact layer 17 (or absorber contact grid) at their end areas 09. The emitter contact layer 13 and the absorber contact layer 17 are electrically insulated with respect to each other by an insulation layer 14.

While the invention has been described with reference to particular embodiments thereof, it will be understood by those having ordinary skill the art that various changes may be made therein without departing from the scope and spirit of the invention. Further, the present invention is not limited to the embodiments described herein; reference should be had to the appended claims.

LIST OF REFERENCE NUMERALS 01 absorber wafer
02 incident light
03 front of 01
04 passivation layer and/or antireflection layer
05 back of 01
06 metallic deposit
07 point contact
08 steep flank of 07
09 end area of 07
10 needle
11 insulating sheath
12 emitter layer
13 emitter contact layer
14 insulation layer
15 face of 07
16 circumferential surface of 07
17 absorber contact layer
18 heterojunction solar cell
19 punctiform via in 12
20 emitter contact system
21 absorber contact system
22 punctiform via in 13

The invention claimed is:

1. A method for the production of a wafer-based, back-contacted heterojunction solar cell having at least one absorber wafer and a back emitter layer each including a respective semiconductor material doped opposite to the other respective semiconductor material, the at least one absorber wafer being contacted by a back absorber contact system including at least one of an absorber contact layer and an absorber contact grid, the emitter layer being contacted by a back emitter contact system including an emitter contact layer, the emitter layer and the emitter contact layer each having corresponding punctiform or strip-shaped vias, the at least one of an absorber contact layer and an absorber contact grid including punctiform or strip-shaped contacts configured to extend through the punctiform or strip-shaped vias of the emitter layer and the emitter contact layer, the back absorber contact system and the back emitter contact system being electrically insulated from one another by an insulation layer, the method comprising:

providing the at least one absorber wafer;

depositing metallic contacts as at least one of point contacts and strip contacts in a predetermined distribution on a back side of the at least one absorber wafer, the contacts having steep flanks that are higher than a cumulative layer thickness of the emitter layer and the emitter contact layer;

sheathing the metallic contacts with an insulating sheath;

depositing the emitter layer over an entire surface of the back side of the at least one absorber wafer;

depositing the emitter contact layer over an entire surface of the emitter layer so as to form the emitter contact system;

selectively removing at least one of the emitter layer and the emitter contact layer so as to expose the steep flanks of the metallic contacts that are covered with the insulating sheath;

depositing the insulation layer over an entire surface of the emitter contact layer so as to provide a narrow contact web at an edge of the at least one absorber wafer;

exposing end areas of the steep flanks of the metallic contacts that are covered by the insulation layer; and depositing the at least one of an absorber contact layer and an absorber contact grid over an entire surface of the insulation layer and over the exposed end areas of the steep flanks of the metallic contacts so as to form the absorber contact system;

so as to provide the heterojunction solar cell with the contact web and with the at least one of an absorber contact layer and an absorber contact grid of the absorber contact system.

2. The method according to claim 1, wherein the at least one of point contacts and strip contacts are respectively deposited in a form of at least one of needles and blades.

3. The method according to claim 1, further comprising cleaning the back side of the at least one absorber wafer before depositing the emitter layer.

4. The method according to claim 3, wherein the cleaning is performed by selective etching.

5. The method according to claim 1, further comprising structuring a front side of the at least one absorber wafer, the front side being located on a side of the heterojunction solar cell that is configured to be exposed to incident light.

6. The method according to claim 5, wherein the structuring is performed by etching so as to texture the front side of the at least one absorber wafer.

7. The method according to claim 6, further comprising depositing at least one of a passivation layer and an antireflection layer onto the structured front side of the at least one absorber wafer.

8. The method according to claim 7, wherein the at least one of a passivation layer and an antireflection layer is deposited by plasma-enhanced chemical vapor deposition of at least one of $SiO_2$ and SiN layers.

9. The method according to claim 1, further comprising contact firing the at least one absorber wafer so as to form local field passivation areas below the contacts.

10. The method according to claim 1, wherein the sheathing the contacts with an insulating sheath includes at least one of:

applying an insulating paste to the contacts by at least one of screen printing and inkjet printing;

depositing an insulating layer over the entire surface of the back side of the at least one absorber wafer and then selectively etching by a punctiform masking layer that is applied by at least one of screen printing and inkjet printing; and performing an electrochemical oxidation of an oxidizable material of the contacts.

11. The method according to claim 1, wherein the depositing the emitter layer over the entire surface of the back side of the at least one absorber wafer is performed using at least one of a metal electron beam physical vapor deposition and a screen printing of metallic pastes.

12. The method according to claim 1, wherein the exposing of the steep flanks of the contacts is performed by etching dosed over time.

13. The method according to claim 1, wherein the depositing the insulation layer over the entire surface of the emitter contact layer is performed by at least one of:

plasma-enhanced chemical vapor deposition;
application coating;
squeegee coating;
screen printing;
inkjet printing; and
spin-coating of at least one of an organic resin and a photoresist.

14. The method according to claim 1, wherein the exposing the end areas of the steep flanks is performed by at least one of mechanical roughening and selective etching.

15. The method according to claim 2, wherein the depositing the at least one of an absorber contact layer and an absorber contact grid is performed by at least one of metal electron beam physical vapor deposition and screen printing with metallic pastes.

* * * * *